(12) United States Patent
Shao et al.

(10) Patent No.: US 8,435,900 B2
(45) Date of Patent: May 7, 2013

(54) METHOD FOR MANUFACTURING A TRANSISTOR

(75) Inventors: Qun Shao, Shanghai (CN); Zhongshan Hong, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 124 days.

(21) Appl. No.: 13/243,977

(22) Filed: Sep. 23, 2011

(65) Prior Publication Data

US 2012/0220128 A1    Aug. 30, 2012

(30) Foreign Application Priority Data

Feb. 24, 2011   (CN) .......................... 2011 1 0045413

(51) Int. Cl.
*H01L 21/331* (2006.01)
*H01L 21/461* (2006.01)

(52) U.S. Cl.
USPC ........... 438/699; 438/689; 438/691; 438/692; 438/693; 438/694; 438/696; 438/697; 438/701; 438/703; 216/37; 216/38; 216/49; 216/41; 216/83; 216/88; 216/89; 216/95; 216/96; 216/99; 216/100

(58) Field of Classification Search ................... 438/689, 438/691, 692, 693, 694, 696, 697, 699, 701, 438/703; 216/37, 38, 41, 46, 83, 88, 89, 216/95, 96, 99, 100

See application file for complete search history.

(56) References Cited

U.S. PATENT DOCUMENTS

| | | | | |
|---|---|---|---|---|
| 5,665,995 A * | 9/1997 | Hsue et al. | ..................... | 257/390 |
| 5,904,558 A * | 5/1999 | Suzuki | ......................... | 438/633 |
| 6,083,850 A * | 7/2000 | Shields | ........................ | 438/763 |
| 6,479,385 B1 * | 11/2002 | Jang et al. | ..................... | 438/691 |
| 6,869,857 B2 * | 3/2005 | Dai et al. | ...................... | 438/427 |
| 6,916,701 B2 * | 7/2005 | Han | ............................. | 438/241 |
| 7,911,001 B2 * | 3/2011 | Lee et al. | ..................... | 257/369 |
| 7,981,801 B2 * | 7/2011 | Chuang et al. | ................ | 438/691 |
| 8,174,058 B2 * | 5/2012 | Marshall et al. | ............. | 257/288 |
| 8,377,770 B2 * | 2/2013 | Liu | .............................. | 438/203 |
| 2008/0179684 A1 * | 7/2008 | Liang et al. | ................... | 257/369 |

FOREIGN PATENT DOCUMENTS

CN   101393894 A   3/2009

* cited by examiner

*Primary Examiner* — Nadine G Norton
*Assistant Examiner* — Christopher Remavege
(74) *Attorney, Agent, or Firm* — Anova Law Group, PLLC (57) ABSTRACT

The invention provides a method for manufacturing a transistor which includes: providing a substrate having a plurality of transistors formed thereon, wherein each transistor includes a gate; forming a stressed layer and a first oxide layer on the transistors and on the substrate successively; forming a sacrificial layer on the first oxide layer; patterning the sacrificial layer to remove a part of the sacrificial layer which covers on the gates of the transistors; forming a second oxide layer on the residual sacrificial layer and on a part of the first oxide layer which is exposed after the part of the sacrificial layer is removed; performing a first planarization process to remove a part of the second oxide layer located on the gates of the transistors; performing a second planarization process to remove the residual second oxide layer; and performing a third planarization process to remove the stressed layer.

13 Claims, 7 Drawing Sheets

METHOD FOR MANUFACTURING A TRANSISTOR

CROSS REFERENCE TO RELATED APPLICATIONS

The present application claims the priority of Chinese Patent Application No. 201110045413.8, entitled "Method for manufacturing a transistor", and filed on Feb. 24, 2011, the entire disclosure of which is incorporated herein by reference.

FIELD OF THE INVENTION

The present invention is generally related to semiconductor manufacturing field, and particularly to a method for manufacturing a transistor.

BACKGROUND OF THE INVENTION

With the development of semiconductor manufacturing technology, to achieve a faster operation speed, a larger memory space and more functions, semiconductor chips are developed in a direction of high integration. As a result, the critical dimension of semiconductor devices becomes smaller continuously. Recently, in large scale integrated circuits, the critical dimension is already in the range from about several tens nanometers to about several hundreds nanometers.

With the continuous scaling down of critical dimension of semiconductor devices, a method for manufacturing transistors with high-k metal gates is adopted in main stream technologies. FIG. 1 to FIG. 4 are schematic cross-sectional views of intermediate structures of the method for manufacturing a transistor in prior art.

Figure 1:
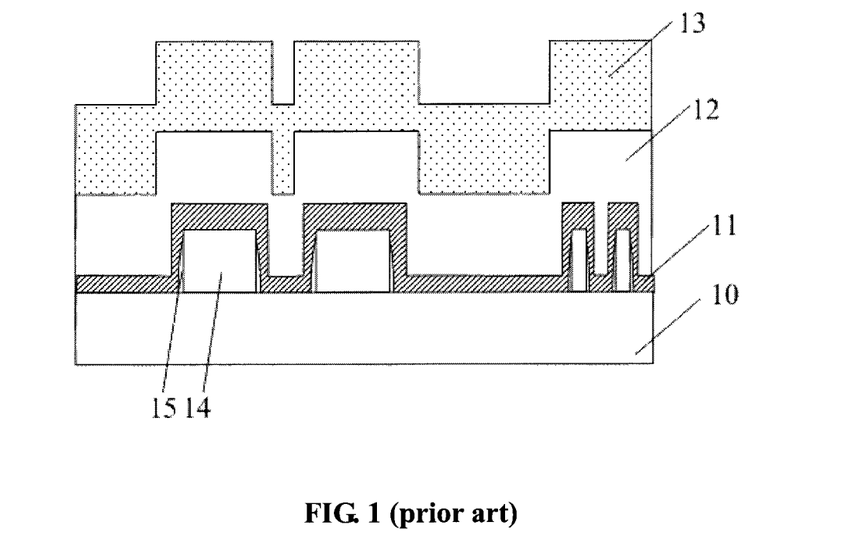
FIG. 1 to FIG. 4 are schematic cross-sectional views of intermediate structures of a method for manufacturing a transistor in prior art.

Referring to FIG. 1, firstly a plurality of transistors are formed on a substrate 10. Each transistor includes a gate 14 and a spacer 15 on sidewalls of the gate 14. The gate includes polysilicon. Then, a stressed layer 11, a first silicon oxide layer 12 and a second silicon oxide layer 13 are formed successively on the gate 14, the spacer 15 and a part of the substrate 10 which is not covered by the transistors. The stressed layer includes silicon nitride and the first silicon oxide layer 12 is formed by a high aspect ratio polymer (HARP) process which has excellent filling properties. The first oxide layer 12 formed by the HARP process is very soft because no annealing process is performed in the HARP process. The second silicon oxide layer 13 is formed by a TEOS method.

Figure 2:
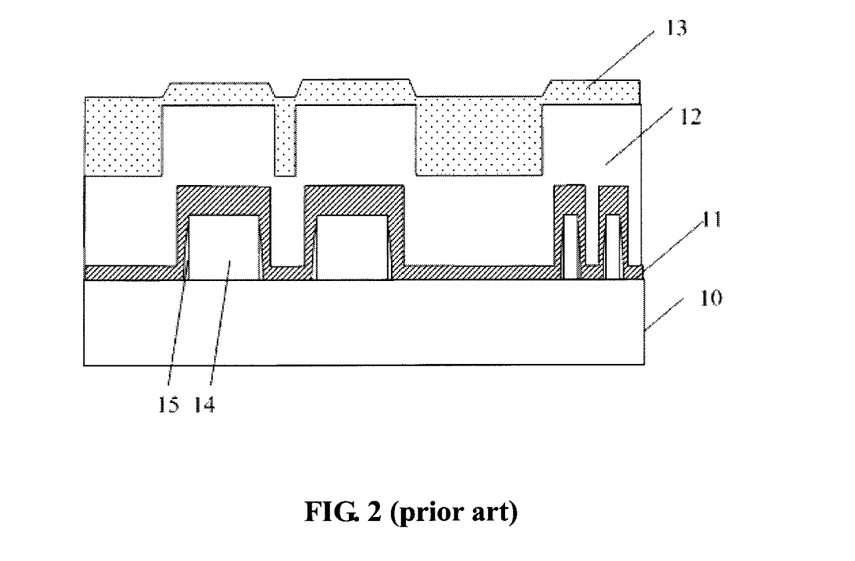

Referring to FIG. 2, bulk silicon oxide is removed by a first chemical mechanical planarization (CMP) process, wherein a part of the second silicon oxide layer 13 is removed in a first CMP process.

Figure 3:
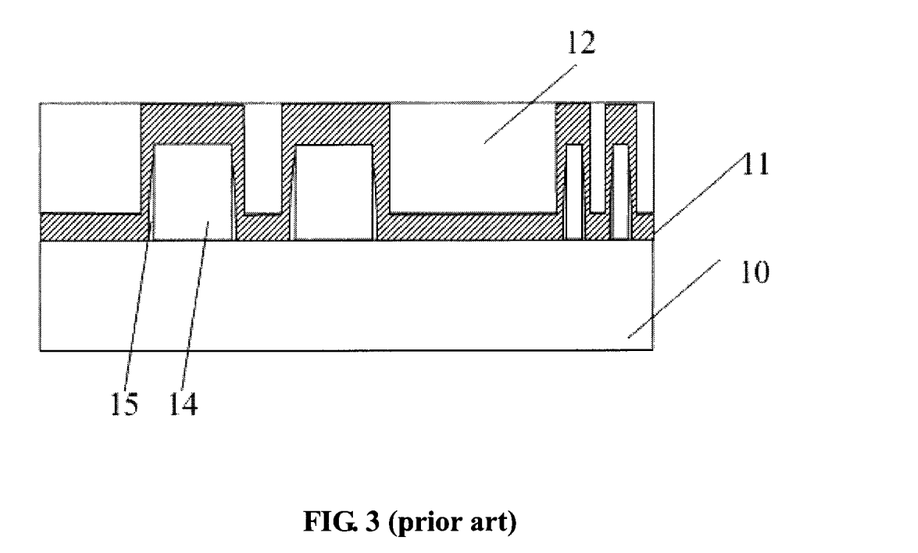

Referring to FIG. 3, silicon oxide on the gate 14 and the spacer 15 is removed by a second CMP process. Specifically, in the second CMP process, the second silicon oxide layer 13 and a part of the first silicon oxide layer 12 are removed, the stressed layer 11 is adopted as a stop layer, and the part of the first silicon oxide layer which is located on the stressed layer 11 is removed completely.

Figure 4:
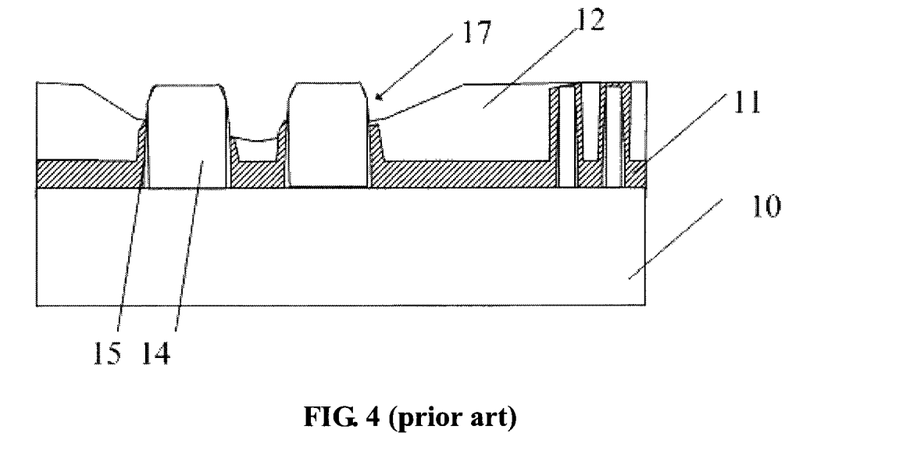

Referring to FIG. 4, silicon nitride on the gate 14 is removed by a third CMP process. In the third CMP process, particles of slurry may agglomerate around the gate 14, and the first silicon oxide layer 12 can be easily abraded because the first silicon oxide layer 12 is very soft, which may induce a dishing 17 around the gate 14 and influence on subsequent manufacturing processes. For example, when a CMP process is performed to materials such as aluminum, the aluminum may remain in the dishing 17. The phenomenon of forming a dishing around the gate 14 in the third CMP process is called Fang Issue in semiconductor manufacturing field.

And the Fang Issue has become a pressing problem which should be solved in semiconductor manufacturing field as quickly as possible.

SUMMARY OF THE INVENTION

An object of the present invention is to solve problems caused by the Fang Issue.

An embodiment of the present invention provides a method for manufacturing a transistor. The method includes: providing a substrate having a plurality of transistors formed thereon, wherein each transistor includes a gate on the substrate; forming a stressed layer and a first oxide layer on the transistor and on the substrate successively; forming a sacrificial layer on the first oxide layer; patterning the sacrificial layer to remove a part of the sacrificial layer which covers on the gates of the transistors, wherein after the patterning process, a height of a top surface of the residual sacrificial layer is approximately equal to a height of a top surface of the stressed layer, and a height of a bottom surface of the residual sacrificial layer is approximately equal to a height of a top surface of the gates; forming a second oxide layer on the residual sacrificial layer and on a part of the first oxide layer which is exposed after the part of the sacrificial layer is removed; performing a first planarization process to remove a part of the second oxide layer located on the gates of the transistors; performing a second planarization process to remove the residual second oxide layer located on the gates of the transistors; and performing a third planarization process to remove the stressed layer located on the gates of the transistors.

Optionally, a selectivity ratio of the sacrificial layer to the stressed layer ranges from 0.9 to 1.1 in the third planarization process.

Optionally, the sacrificial layer includes a same kind of material as the stressed layer.

Optionally, the sacrificial layer and the stressed layer both include silicon nitride.

Optionally, a thickness of the first oxide layer is 0.7 to 1.3 times as thick as a difference between a height of the gates and a thickness of the stressed layer.

Optionally, the bottom surface of the sacrificial layer is substantially flush with the top surface of the gates, and the thickness of the first oxide layer is equal to the difference between the height of the gates and the thickness of the stressed layer.

Optionally, a thickness of the sacrificial layer is 0.7 to 1.3 times as thick as a difference between the height of the gates and the thickness of the first oxide layer.

Optionally, the top surface of the sacrificial layer is substantially flush with the top surface of the stressed layer, and the thickness of the sacrificial layer is equal to the difference between the height of the gates and the thickness of the first oxide layer.

Optionally, the sacrificial layer covers a region in which intervals between the gates are greater than 1 µm.

Optionally, the thickness of the sacrificial layer ranges from 200 Å to 800 Å.

Optionally, the second planarization process includes: adopting the stressed layer as a stop layer.

Optionally, the third planarization process includes: adopting the top surface of the gate of the transistor as a stop layer.

Optionally, the first planarization process, the second planarization process and the third planarization process are chemical mechanical planarization(CMP).

Compared with the prior art, the embodiments of the present invention have the following advantages. The third planarization process is performed to a part of the sacrificial layer located between the gates of the transistors and a part of the stressed layer located on the transistors, wherein the sacrificial layer can prevent particles of a slurry used from agglomerating around the gate. Moreover, because the sacrificial layer includes the same material as the stressed layer (or the removal rate of the sacrificial layer is close to the removal rate of stressed layer), dishing around the gates can be avoided. Therefore, Fang Issue can be reduced and performance of the transistors formed can be enhanced.

DETAILED DESCRIPTION OF THE EMBODIMENTS

To make sure that the above-mentioned and other objectives, features and advantages of the present invention become clearer, embodiments of the present invention will be described with attached drawings in detail as follows.

Although the present invention will be disclosed hereinafter with reference to preferred embodiments in detail, it also can be implemented in other different embodiments. Therefore, the present invention should not be limited by the embodiments disclosed hereinafter.

Figure 5:
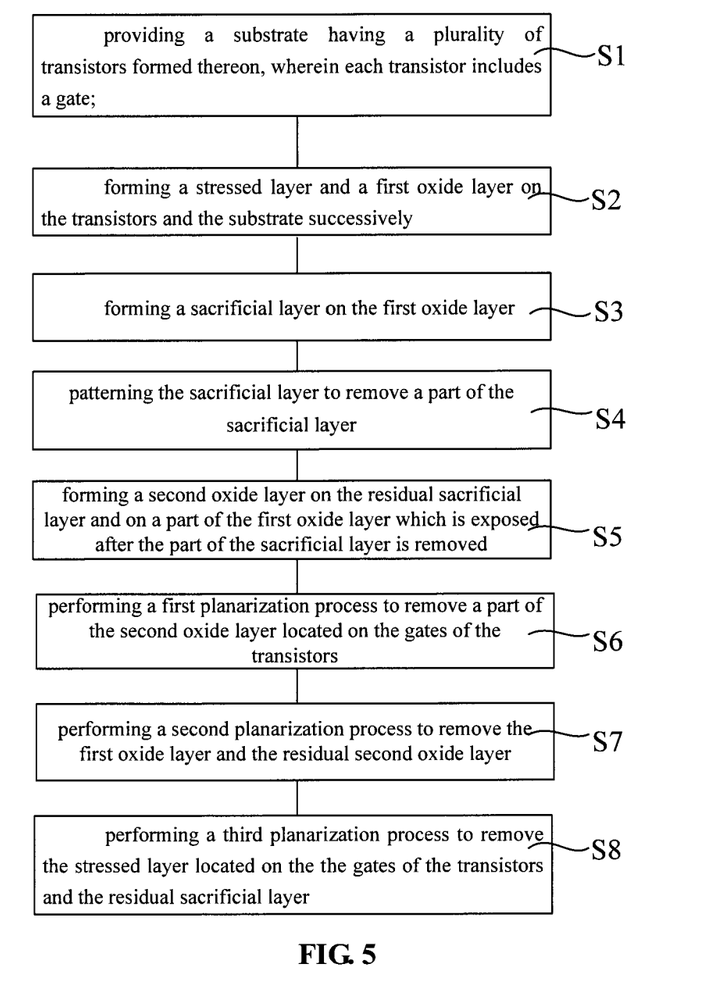
FIG. 5 is a flow chart of a method for manufacturing a transistor in an embodiment of the present invention.

As described in the background of the present invention, a dishing may be formed around a gate according to the method for manufacturing a transistor in prior art, which may impair the performance of the transistor. To solve the problem mentioned above, an embodiment of the present invention provides a method for manufacturing a transistor. FIG. 5 is a flow chart of a method for manufacturing a transistor in the embodiment. Referring to FIG. 5, the method includes:

Step S1, providing a substrate having a plurality of transistors formed thereon;

Step S2, forming a stressed layer and a first oxide layer on the transistors and on the substrate successively;

Step S3, forming a sacrificial layer on the first oxide layer;

Step S4, patterning the sacrificial layer to remove a part of the sacrificial layer which covers gates of the transistors;

Step S5, forming a second oxide layer on the residual sacrificial layer and on a part of the first oxide layer which is exposed after the part of sacrificial layer is removed;

Step S6, performing a first planarization process to remove a part of the second oxide layer located on the gates of the transistors;

Step S7, performing a second planarization process to remove the residual second oxide layer located on the sacrificial layer and the first oxide layer located on the gates of the transistors; and Step S8, performing a third planarization process to remove the stressed layer located on the gates of the transistors and the residual sacrificial layer located between the gates of the transistors.

The embodiment of the present invention will be described in detail as follows accompanying with FIG. 6 to FIG. 13, which are schematic cross-sectional views of intermediate structures of a method for manufacturing a transistor in the embodiment of the present invention.

Figure 6:
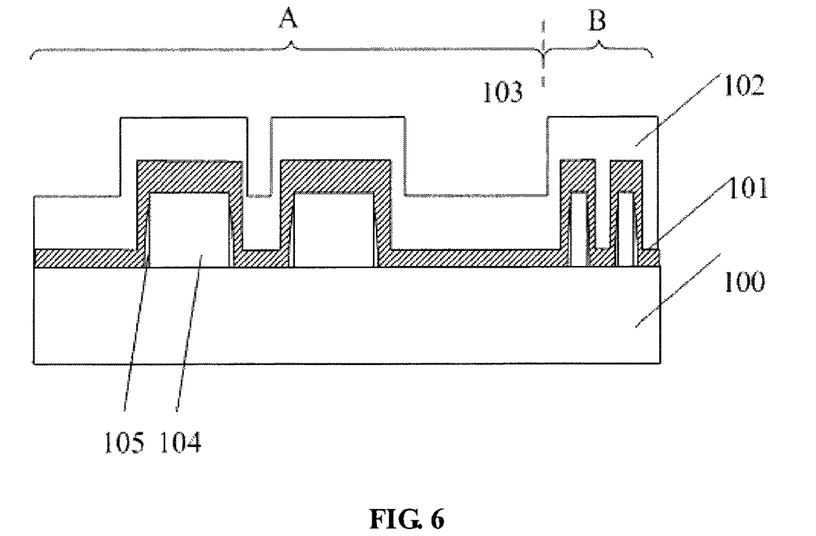
FIG. 6 to FIG. 13 are schematic cross-sectional views of intermediate structures of a method for manufacturing a transistor in the embodiment of the present invention.

Referring to FIG. 6, in the step S1, a substrate 100 is provided. This substrate may include single-crystal silicon, silicon germanium, silicon on insulator (SOI), or III-V compound, such as gallium arsenide, and other suitable materials.

In the embodiment, a plurality of transistors are formed on the substrate 100 which includes a MOS transistor isolation region A and a MOS transistor dense region B. In the MOS transistor isolation region A, intervals between the transistors are more than 1 μm. But, in the MOS transistor dense region B, intervals between the transistors are less than or equal to 1 μm.

Each MOS transistor includes a gate 104, a spacer 105 which is on sidewalls of the gate 104 and source/drain regions formed at opposite sides of the gate 104 on the substrate 100. And the MOS transistors are formed on the substrate 100 by using same materials and same processes as the prior art.

Then, a stressed layer 101 and a first oxide layer 102 are formed successively on the MOS transistors. The stressed layer 101 includes silicon nitride. The first oxide layer 102 includes silicon oxide and is formed by a HARP process to achieve great filling performance.

It should be noted that, in subsequent processes, a sacrificial layer is formed on the first oxide layer 102. To make sure that the sacrificial layer can prevent particles of slurry from agglomerating around the gates 104 in a subsequent third planarization process, a height of a bottom surface of the sacrificial layer should be approximately equal to a height of a top surface of the gate. In addition, because a top surface of the first oxide layer 102 will become a bottom surface of the sacrificial layer formed in subsequent steps, a location of the sacrificial layer will be determined by a thickness of the first oxide layer 102.

Specifically, the thickness of the first oxide layer 102 should be 0.7 to 1.3 times as thick as a difference between a height of the gates 104 and a thickness of the stressed layer 101, so that the height of the top surface of the first oxide layer 102 is approximately equal to the height of the top surface of the gate 104, thereby making a height of the bottom surface of the sacrificial layer be approximately equal to the height of the top surface of the gate 104.

Optionally, the top surface of the first oxide layer 102 located between the gates is substantially flush with the top surface of the gates 104. In other words, the thickness of the first oxide layer is equal to the difference between the height of the gates and the thickness of the stressed layer. For example, if the height of the gates 104 ranges from 500 Å to 800 Å, and the thickness of the stressed layer ranges from 250 Å to 350 Å, accordingly, the thickness of the first oxide layer ranges from 150 Å to 650 Å.

Figure 7:
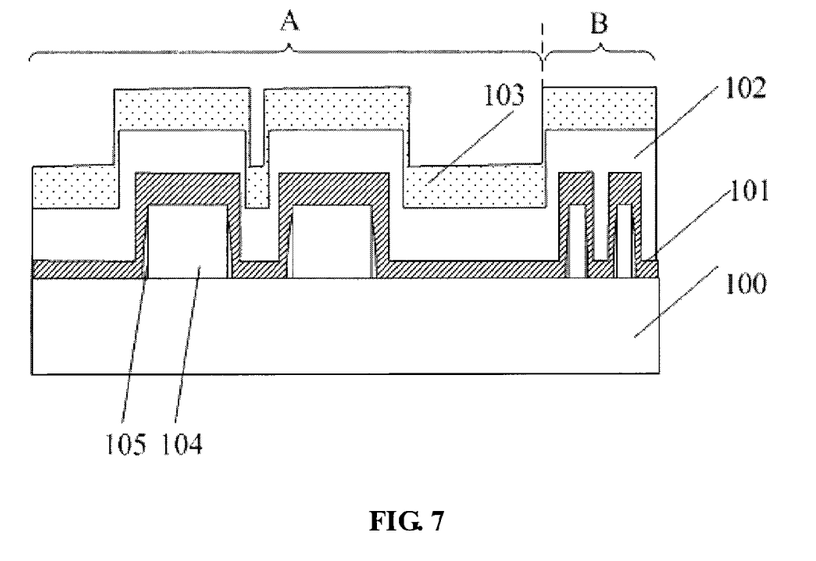

Referring to FIG. 7, in the step S2, the first oxide layer 102 is covered by the sacrificial layer 103. Optionally, the sacrificial layer 103 may include a same material as the stressed layer 101, or include a material having a selectivity ratio of the sacrificial layer 103 to the stressed layer 101 in the third planarization process ranging from 0.9 to 1.1. In the embodiment, the sacrificial layer 103 and the stressed layer 101 both include silicon nitride.

It should be noted that, if the sacrificial layer is too thick, manufacturing materials may be wasted and the sacrificial layer may be more difficult to be removed. In contrast, if the sacrificial layer is too thin, the sacrificial layer can't prevent particles of slurry from agglomerating around the gate 104 in the third planarization process. Therefore, a height of a top surface of the sacrificial layer 103 should be approximately equal to a height of a top surface of the stressed layer 101 which is located on the top of the gate 104. Specifically, a thickness of the sacrificial 103 should be 0.7 to 1.3 times as thick as a difference between the height of the gate 104 and the thickness of the first oxide layer 102. Optionally, the thickness of the sacrificial layer 103 is equal to the difference between the height of the gates 104 and the thickness of the first oxide layer 102.

In the embodiment, the sacrificial layer has a thickness ranging from 200 Å to 800 Å, and is formed by chemical vapor deposition (CVD) method.

It also should be noted that, in the MOS transistor dense region B, intervals between the gates are sealed off (shown in FIG. 7) after the first oxide layer 102 is formed, because the intervals between the gates are less than 1 μm. Therefore, the sacrificial layer 103 can't be filled into the intervals between the gates. In other words, the sacrificial layer 103 only covers the top surface of the transistors.

Thereafter, in the step S3, a patterning process is performed to the sacrificial layer, so as to remove a part of the sacrificial layer which covers the gates of the transistors. The patterning process includes the following steps:

covering the sacrificial layer with a photoresist layer;
patterning the photoresist layer to form a photoresist pattern; and
etching the sacrificial layer by taking the photoresist pattern as a mask, in order to remove the part of the sacrificial layer which covers the gates of the transistors.

Figure 8:
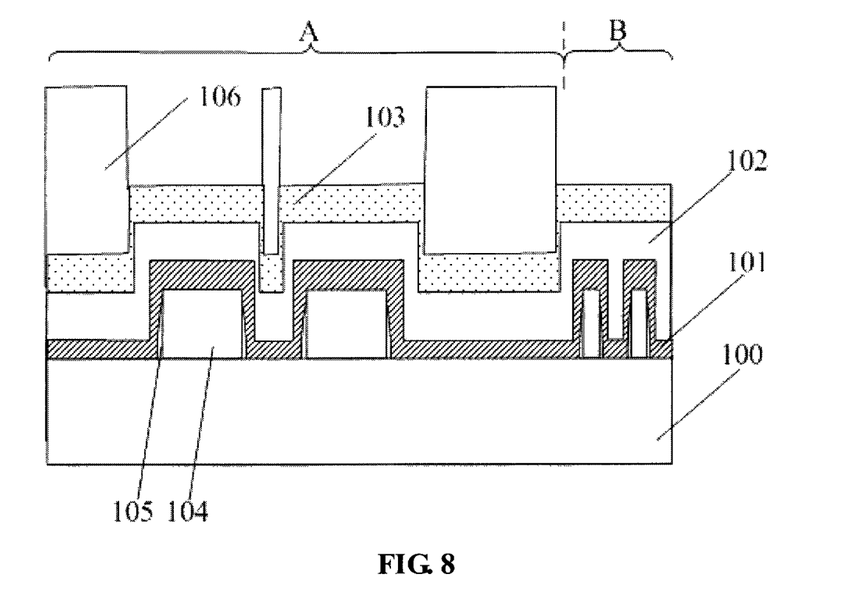

Referring to FIG. 8, after the photoresist layer is patterned, a photoresist pattern 106 is formed. The photoresist pattern 106 covers a region in which the intervals between the gates are greater than 1 μm. Specifically, the photoresist pattern 106 covers the top of a part of the substrate 100 which is between the MOS transistors in the MOS transistor isolation region A. Because the intervals between the transistors in MOS transistor dense region B are less than 1 μm, so the pattern 106 doesn't cover the MOS transistor dense region B.

Figure 9:
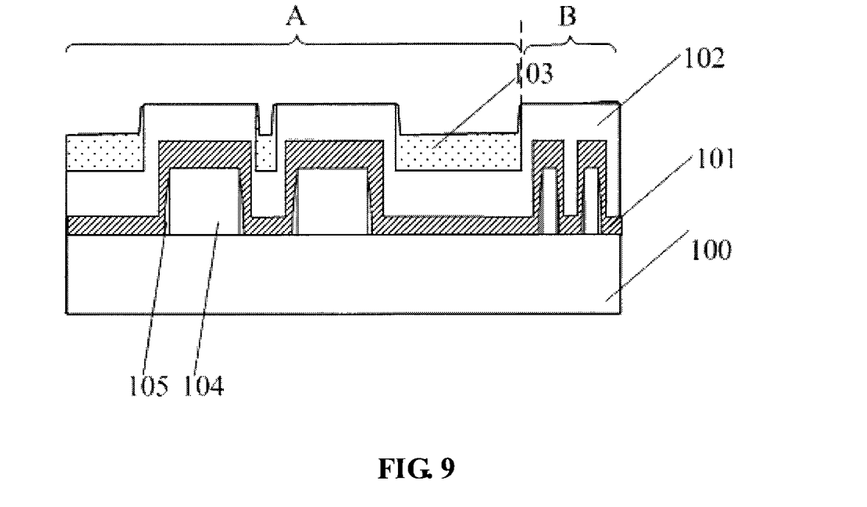

Referring to FIG. 9, the sacrificial layer 103 is etched by using the photoresist pattern 106 as a mask so that the part of the sacrificial layer covering the gates of the transistors is removed, while a part of the sacrificial layer located between the gates 104 is reserved. After the part of sacrificial layer covering the gates of the transistors is removed, the etching process is stopped at the first oxide layer which is located on the top of the gates of the transistors. Specifically, the etching method adopted to etch the sacrificial layer may include a dry etching or a wet etching.

Figure 10:
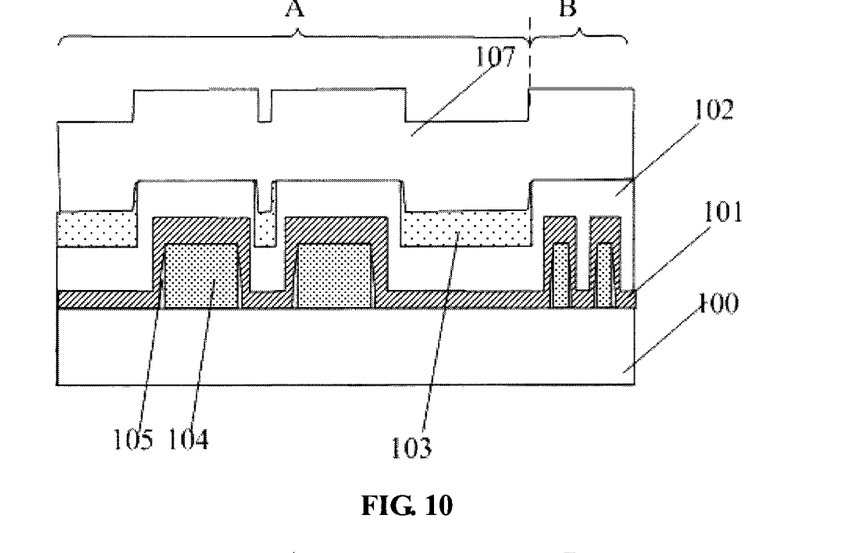

Referring to FIG. 10, in the step S4, a second oxide layer 107 is formed on the residual sacrificial layer 103 and on a part of the first oxide layer 102 which is exposed after the part of the sacrificial layer covering the gates of the transistors is removed. Optionally, the second oxide layer 107 may include silicon oxide and is formed by TEOS method.

Figure 11:
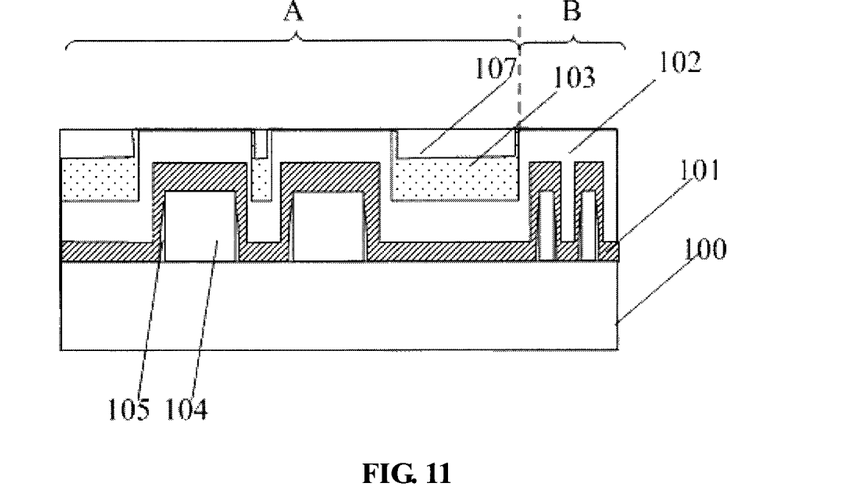

Referring to FIG. 11, in the step S5, the first planarization process is performed to remove a part of the second oxide layer 107 which is located on the top of the gates of the transistors 104 until the first oxide layer 102 which is located on the top of the gates 104 of the transistors is exposed, wherein the first planarization process is a CMP process and a slurry adopted in the CMP process is the same as that of the prior art.

Figure 12:
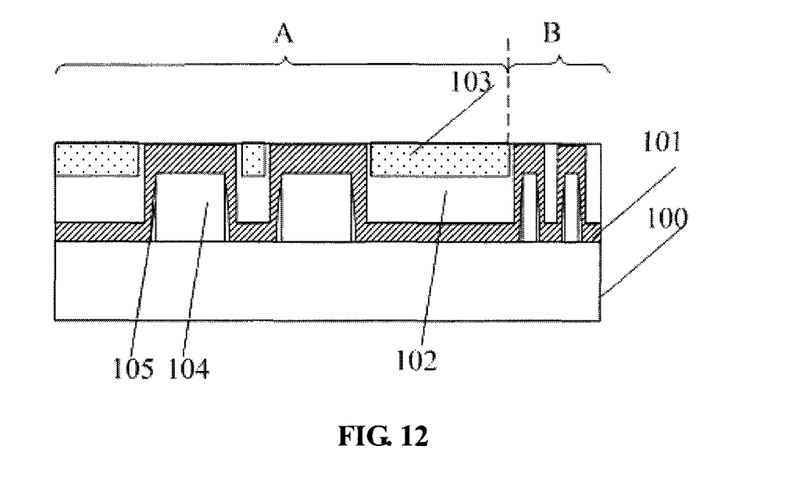

Referring to FIG. 12, in the step S6, the second planarization process is performed to remove the first oxide layer 102 which is located on the top of the gates 104 of the transistors and the residual second oxide layer 107 which is located on the top of the sacrificial layer 103. Specifically, the second planarization process is a CMP process and adopts the stressed layer 101 and the sacrificial layer 103 located between the gates 104 of the transistors as stop layers. For example, if the first oxide layer 102 and the second oxide layer 107 both include silicon oxide and the sacrificial layer includes silicon nitride, a slurry used in the second planarization process will provide a selectivity ratio of silicon oxide to silicon nitride which is greater than 1.

Figure 13:
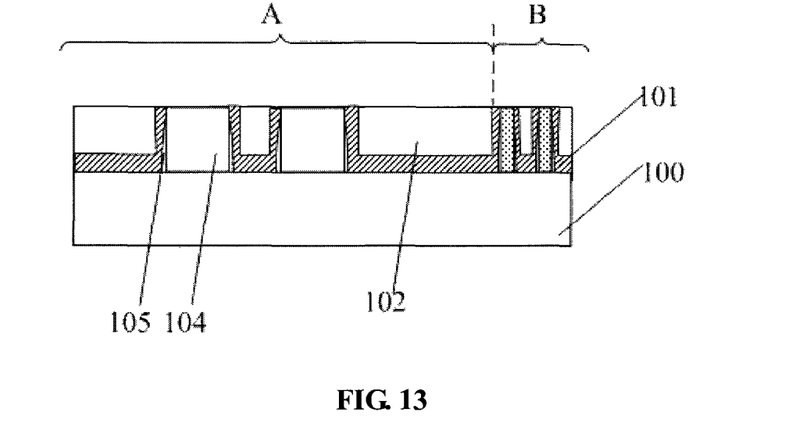

Referring to FIG. 13, in the step S7, the third planarization process is performed to remove the stressed layer 101 which is located on the gates 104 of the transistors and to remove the part of the sacrificial layer 103 which is between the gates 104 of the transistors. Specifically, the third planarization process is a CMP process, and a top surface of gate 104 is adopted as a stop layer. a slurry used in the third planarization process provides a selectivity ratio of the stressed layer 101 to the sacrificial layer 103 which is greater than 1.

It should be noted that, because the height of the top surface of the sacrificial layer 103 is approximately equal to the height of the top surface of the stressed layer 101 and the height of the bottom surface of the sacrificial layer 103 is approximately equal to the height of the top surface of the gates 104 of the transistors, the third CMP process is performed to the part of the sacrificial layer 103 located between the gates of the transistors and the part of the stressed layer 101 located on the transistors, which is very different from the convention method which is performed to a first oxide layer and a stressed layer, wherein the sacrificial layer 103 can prevent particles of the slurry from agglomerating around the gate 104. Moreover, because the sacrificial layer 103 includes the same material as the stressed layer (or the removal rate of the sacrificial layer is close to the removal rate of stressed layer), dishing around the gates 104 can be avoided. Therefore, Fang Issue can be reduced and performance of the transistors formed can be enhanced.

The embodiments of the present invention further includes subsequent processes for forming a high-k dielectric metal gate, which are similar to those provided in the prior art, so these processes are not illustrated hereinafter.

Although the present invention has been disclosed as above with reference to preferred embodiments, it is not intended to limit the present invention. Those skilled in the art may modify and vary the embodiments without departing from the spirit and scope of the present invention. Accordingly, the scope of the present invention shall be defined in the appended claims.

What is claimed is:

1. A method for manufacturing a transistor, comprising:
providing a substrate having a plurality of transistors formed thereon, wherein each transistor comprises a gate;
forming a stressed layer and a first oxide layer on the transistors and on the substrate successively;
forming a sacrificial layer on the first oxide layer;
patterning the sacrificial layer to remove a part of the sacrificial layer which covers the gates on the substrate, wherein after the patterning process, a height of a top surface of the residual sacrificial layer is approximately equal to a height of a top surface of the stressed layer located on the gates, and a height of a bottom surface of the residual sacrificial layer is approximately equal to a height a top surface of the gate;
forming a second oxide layer on the residual sacrificial layer and on a part of the first oxide layer which is exposed after the part of the sacrificial layer is removed;
performing a first planarization process to remove a part of the second oxide layer located on the gates of the transistors;

performing a second planarization process to remove the first oxide layer and the residual second oxide layer; and performing a third planarization process to remove the stressed layer located on the gates of the transistors and the residual sacrificial layer.

2. The method for manufacturing a transistor according to claim 1, wherein a selectivity ratio of the sacrificial layer to the stressed layer ranges from 0.9 to 1.1 in the third planarization process.

3. The method for manufacturing a transistor according to claim 2, wherein the sacrificial layer comprises a same material as the stressed layer.

4. The method for manufacturing a transistor according to claim 3, wherein the sacrificial layer and the stressed layer both comprise silicon nitride.

5. The method for manufacturing a transistor according to claim 1, wherein a thickness of the first oxide layer is 0.7 to 1.3 times as thick as a difference between a height of the gates and a thickness of the stressed layer.

6. The method for manufacturing a transistor according to claim 5, wherein the bottom surface of the sacrificial layer is substantially flush with the top surface of the gate, and the thickness of the first oxide layer is equal to the difference between the height of the gates and the thickness of the stressed layer.

7. The method for manufacturing a transistor according to claim 1, wherein a thickness of the sacrificial layer is 0.7 to 1.3 times as thick as a difference between the height of the gates and the thickness of the first oxide layer.

8. The method for manufacturing a transistor according to claim 7, wherein the top surface of the sacrificial layer is substantially flush with the top surface of the stressed layer, and the thickness of the sacrificial layer is equal to the difference between the height of the gates and the thickness of the first oxide layer.

9. The method for manufacturing a transistor according to claim 1, wherein the sacrificial layer covers a region in which intervals between the gates are greater than 1 μm.

10. The method for manufacturing a transistor according to claim 7, wherein the thickness of the sacrificial layer ranges from 200 Å to 800 Å.

11. The method for manufacturing a transistor according to claim 1, wherein the second planarization process comprises: adopting the stressed layer as a stop layer.

12. The method for manufacturing a transistor according to claim 1, wherein the third planarization process comprises: adopting a top surface of the gate of the transistor as a stop layers.

13. The method for manufacturing a transistor according to claim 1, wherein the first planarization process, the second planarization process and the third planarization process are chemical mechanical planarization (CMP).

* * * * *